(12) United States Patent
Niigata

(10) Patent No.: US 7,787,246 B2
(45) Date of Patent: Aug. 31, 2010

(54) COMPUTER DEVICE AND CLUSTER SERVER DEVICE

(75) Inventor: Katsuya Niigata, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/315,155

(22) Filed: Dec. 23, 2005

(65) Prior Publication Data

US 2006/0098406 A1    May 11, 2006

Related U.S. Application Data

(63) Continuation of application No. PCT/JP03/10343, filed on Aug. 14, 2003.

(51) Int. Cl.
| | |
|---|---|
| H05K 5/00 | (2006.01) |
| G06F 3/00 | (2006.01) |
| G06F 3/06 | (2006.01) |
| G06F 11/00 | (2006.01) |
| G06F 15/16 | (2006.01) |

(52) U.S. Cl. ............................. 361/679.37; 361/679.33; 361/679.39; 710/38; 710/1; 711/4; 711/114; 714/2; 714/5; 714/6; 709/201; 709/216

(58) Field of Classification Search ................. 361/685, 361/724–727; 710/1, 114; 711/4, 114; 714/6; 709/216, 201
See application file for complete search history.

(56) References Cited

U.S. PATENT DOCUMENTS

| | | | |
|---|---|---|---|
| 5,596,709 A | 1/1997 | Bond et al. | |
| 5,822,184 A * | 10/1998 | Rabinovitz | 361/685 |
| 6,188,571 B1 * | 2/2001 | Roganti et al. | 361/685 |
| 6,325,636 B1 | 12/2001 | Hipp et al. | |
| 6,571,310 B1 * | 5/2003 | Ottesen et al. | 711/5 |
| 2003/0196126 A1 * | 10/2003 | Fung | 713/300 |
| 2004/0088482 A1 * | 5/2004 | Tanzer et al. | 711/114 |

FOREIGN PATENT DOCUMENTS

| | | |
|---|---|---|
| JP | 5-334006 | 12/1993 |
| JP | 05-334006 | 12/1993 |
| JP | 8-137631 | 5/1996 |
| JP | 9-16343 | 1/1997 |
| JP | 11-184643 | 7/1999 |

OTHER PUBLICATIONS

International Search Report in corresponding Application No. PCT/JP03/10343 dated Nov. 18, 2003.
Yasumasa Honjo et al., "IA Server: Primergy, Fujitsu", Nov. 8, 2001, vol. 53, No. 6, pp. 463-470.

(Continued)

*Primary Examiner*—Zachary M Pape
(74) *Attorney, Agent, or Firm*—Staas & Halsey LLP

(57) ABSTRACT

A computer device includes a plurality of information processing units configured to execute respective information processing functions, a plurality of storage units, one of which is arranged in each of the information processing units, and which are removable, a plurality of storage devices physically dispersed in the storage units, and having a redundant configuration, where one storage unit includes at least two storage devices, and a plurality of controllers configured to be installed in the information processing units, and to access the storage devices, where each information processing unit includes one of the controllers.

15 Claims, 10 Drawing Sheets

OTHER PUBLICATIONS

European Search Report in corresponding European Application No. 03818109.5 dated Nov. 24, 2006 (5 pp).

"Phoenix Blade Server 318 Series" Internet Citation (online at http://www.phoenixdatacom.com/pbs318_320_brochure.pdf), Jun. 2002, pp. 1-6.

Korean Office Action: 05-09-2007-042209979: Mailed Jul. 31, 2007.

Yasumasa Honjo et al., "IA server: Primergy, Fujitsu" Nov. 8, 2001, vol. 53, No. 6, p. 466.

Japanese Office Action mailed on Apr. 7, 2009 in corresponding Japanese Patent Application 2005-507752.

* cited by examiner

PRIOR ART

PRIOR ART

US 7,787,246 B2

COMPUTER DEVICE AND CLUSTER SERVER DEVICE

This application is a continuing application, filed under 35 U.S.C. §111(a), of International Application PCT/JP2003/010343, filed Aug. 14, 2003.

BACKGROUND OF THE INVENTION

1. Field of the Invention

The present invention relates to a computer device and a cluster server device that can hot-swap a storage device having a redundant configuration, in a plurality of information processing units.

2. Description of the Related Art

FIG. 9 is a perspective view of an external configuration of a conventional computer device 10. The computer device 10 is, for example, a server device including a central processing unit (CPU) (not shown), a hard disk controller (HDD), and the like, provided inside a casing 11.

Two slots $12_1$ and $12_2$ are formed in a front face of the casing 11. Hard disks (HDD) $13_1$ and $13_2$ are removably inserted into the slots $12_1$ and $12_2$.

The HDD controller controls writing to and reading from the HDDs $13_1$ and $13_2$, which are large-capacity storage devices that store various types of data handled by the CPU. The HDDs $13_1$ and $13_2$ are arranged in a redundant configuration.

A mirror ring is used to store identical data in the HDDS $13_1$ and $13_2$, so that one can be used for recovery if the other breaks down.

The computer device 10 also includes a function of, when one of the HDDs $13_1$ and $13_2$ breaks down, replacing the broken HDD without terminating the operation of the computer device 10 (hot-swap).

If the HDD $13_1$ breaks down, data is recovered from the HDD $13_2$. The broken HDD $13_1$ is removed from the slot $12_1$ without terminating the operation of the computer device 10, and a replacement HDD (not shown) is inserted into the slot $12_1$.

Japanese Patent Application Laid-Open No. H11-184643 discloses a conventional computer device. FIG. 10 is a perspective view of an external configuration of a conventional computer device 20. The computer device 20 is a cluster server device (blade server device) in which a plurality of card-type information processing units $30_1$ to $30_n$ can be inserted into a casing 21. Each of the information processing units $30_1$ to $30_n$ has the same functions as the computer device 10 (see FIG. 9).

'n' number of slots $22_1$ to $22_n$ are formed in a front face of the casing 21. The information processing units $30_1$ to $30_n$ are removably inserted into the slots $22_1$ to $22_n$.

FIG. 11 is a cross section taken along line X-X' of FIG. 10. In FIG. 11, like reference numerals designate like parts as those shown in FIG. 10. In FIG. 11, a back plane 23 is provided inside the casing 21, and is physically and electrically connected to the information processing units $30_1$ to $30_n$ (see FIG. 10). The back plane 23 supplies electrical power to the information processing units $30_1$ to $30_n$, and has a function of providing an interface.

The information processing unit $30_1$ consists of a card-shaped printed circuit board $31_1$, an HDD $32A_1$, an HDD $32B_1$, a CPU $33_1$, and an HDD controller $34_1$, and includes the same server functions as the computer device 10, as mentioned already.

The HDD $32A_1$, the HDD $32B_1$, the CPU $33_1$, and the HDD controller $34_1$ are mounted on the printed circuit board $31_1$. The information processing unit $30_1$ is mounted on the back plane 23 via a connector $35_1$.

The HDD controller $34_1$ controls writing to and reading from the HDD $32A_1$ and the HDD $32B_1$, which are large-capacity storage devices that store various types of data handled by the CPU $33_1$. The HDD $32A_1$ and the HDD $32B_1$ are arranged in a redundant configuration.

A mirror ring is used to store identical data in the HDDs $32A_1$ and $32B_1$, so that one can be used for recovery if the other breaks down. Therefore, if the HDD $32A_1$ breaks down, data is recovered from the HDD $32B_1$.

In the conventional computer device 20 (FIGS. 10 and 11), the HDD $32A_1$ and the HDD $32B_1$ in the information processing unit $30_1$ shown in FIG. 11 have a redundant configuration. However, although data can be recovered from one of the HDDs if the other breaks down, there is a problem that the broken HDD cannot be hot-swapped.

The HDD $32A_1$ and the HDD $32B_1$ are mounted on the same printed circuit board $31_1$, and to replace the broken HDD $32A_1$, the entire printed circuit board $31_1$ must be removed from the back plane 23, and the operation of the information processing unit $30_1$ (server) must be terminated while the broken HDD $32A_1$ is replaced with a replacement HDD. The information processing unit $30_1$ must then be remounted on the back plane 23.

SUMMARY OF THE INVENTION

It is an object of the present invention to at least solve the problems in the conventional technology.

According to an aspect of the present invention, a computer device includes a plurality of information processing units configured to execute respective information processing functions; a plurality of storage devices configured to be mounted in the information processing units in a physically dispersed manner, and configured to have a redundant configuration; and a controller configured to access the storage devices.

According to another aspect of the present invention, a computer device includes a plurality of information processing units configured to execute respective information processing functions; a plurality of storage units configured to form a part of the information processing units, and configured to be removably mounted therein; a plurality of storage devices configured to be mounted in the storage units in a physically dispersed manner, and configured to have a redundant configuration, where one storage unit includes at least two storage devices; and a plurality of controllers configured to be mounted in the information processing units and to access the storage devices, where each information processing unit includes one of the controllers. According to still another aspect of the present invention, a cluster server device includes a plurality of information processing units, each including a server function; a plurality of storage devices configured to be mounted in the information processing units in a physically dispersed manner, and configured to have a redundant configuration; and a controller configured to access the storage devices.

According to still another aspect of the present invention, a cluster server device includes a plurality of information processing units, each including a server function; a plurality of storage units configured to form a part of the information processing units, and configured to be removably mounted therein; a plurality of storage devices configured to be mounted in the storage units in a physically dispersed manner, and configured to have a redundant configuration; and a plurality of controllers configured to be respectively mounted in the information processing units, and to access the storage devices, where each information processing unit includes one of the controllers.

The above objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Exemplary embodiments of the present invention will be explained in detail below with reference to the accompanying drawings.

Figure 1:
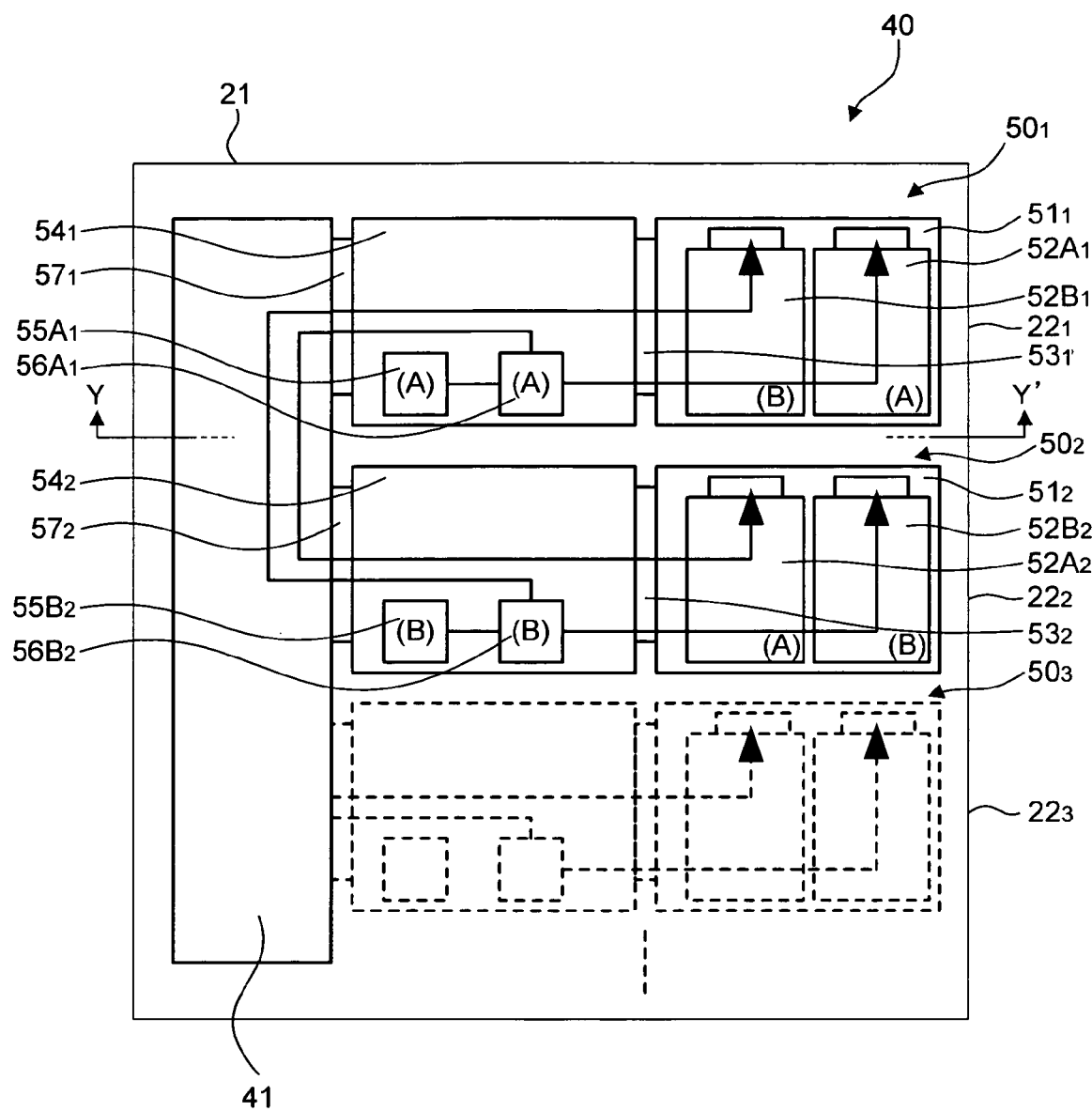
FIG. 1 is a schematic plan view of a configuration of a computer device according to a first embodiment of the present invention.
Figure 2:
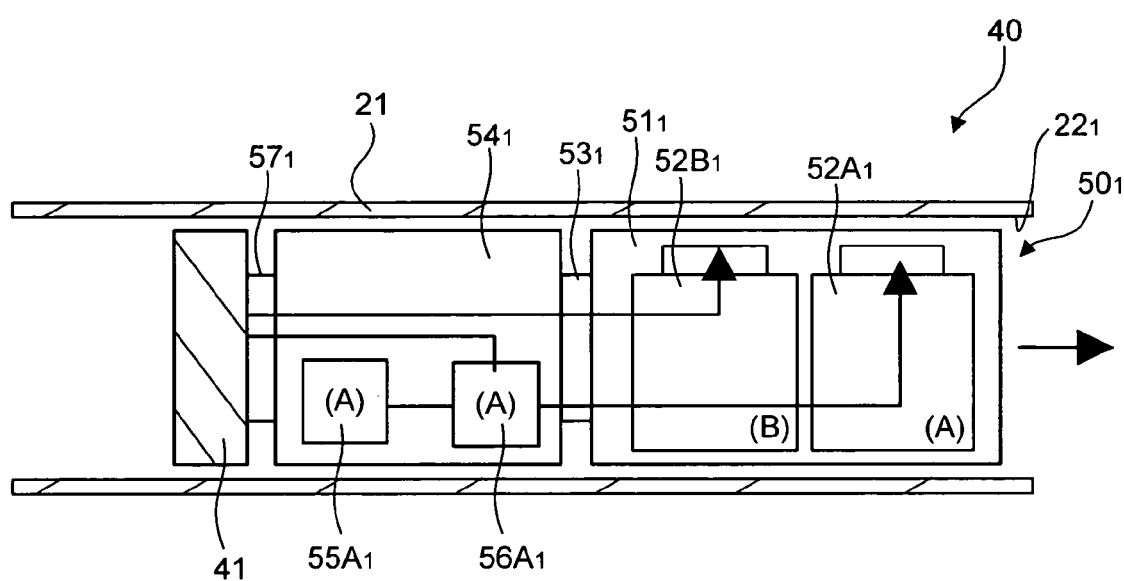
FIG. 2 is a cross section taken along line Y-Y' of FIG. 1.

FIG. 1 is a schematic plan view of a configuration of a computer device according to a first embodiment of the present invention. FIG. 2 is a cross section taken along line Y-Y' of FIG. 1. In FIGS. 1 and 2, like reference numerals designate like parts as those shown in FIGS. 10 and 11.

A computer device 40 shown in FIG. 1 is a cluster server device (blade server device) in which a plurality of information processing units $50_1, 50_2, 50_3, \ldots$ can be provided in the casing 21.

Figure 10:
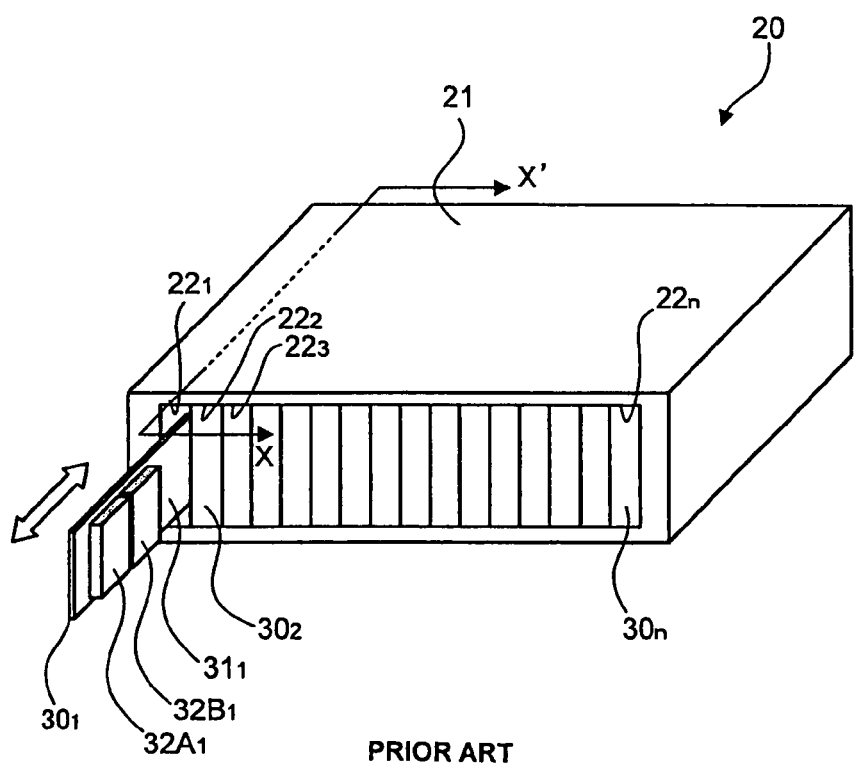
FIG. 10 is a perspective view of the external configuration of a conventional computer device.
Figure 11:
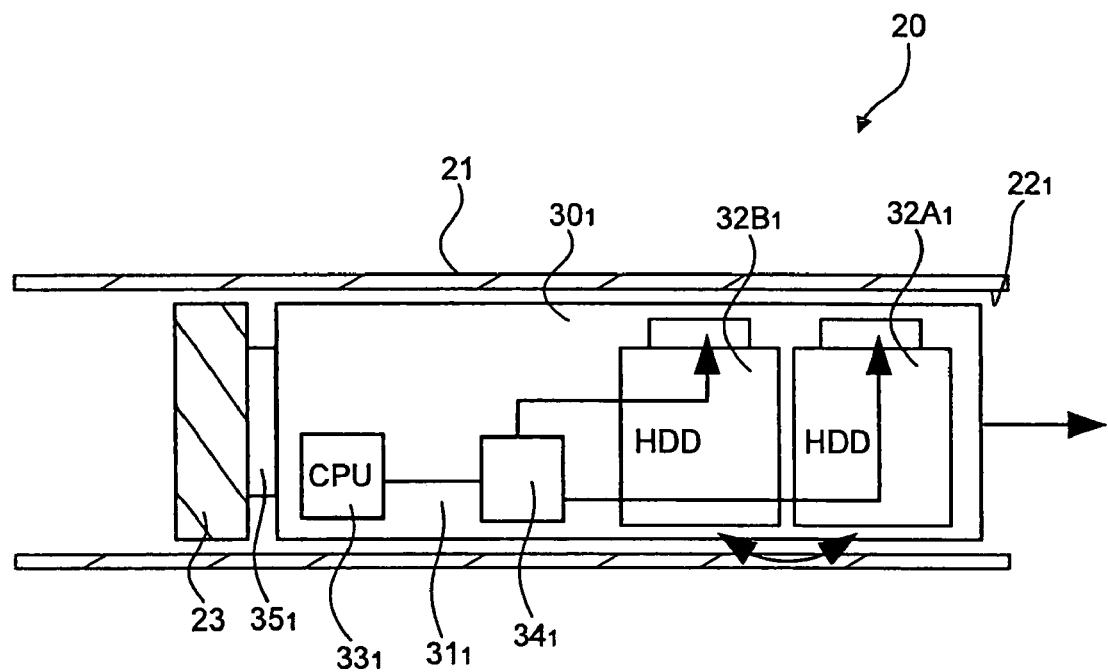
FIG. 11 is a cross section taken along line X-X' of FIG. 10.

In FIG. 1, although the information processing units $50_1, 50_2, 50_3, \ldots$ are provided vertically in the same manner as the information processing units $30_1, 30_2, \ldots$ shown in FIG. 10, they are depicted in a plan view in the drawing.

The information processing units $50_1, 50_2, 50_3, \ldots$ can be freely inserted into and removed from slots $22_1, 22_2, 22_3, \ldots$ in the casing 21.

A back plane 41 is provided inside the casing 21, and is physically and electrically connected to the information processing units $50_1, 50_2, \ldots$ via connectors $57_1, 57_2, \ldots$ (see FIG. 2). The back plane 41 supplies electrical power to the information processing units $50_1, 50_2, 50_3, \ldots$, and provides an interface.

Figure 9:
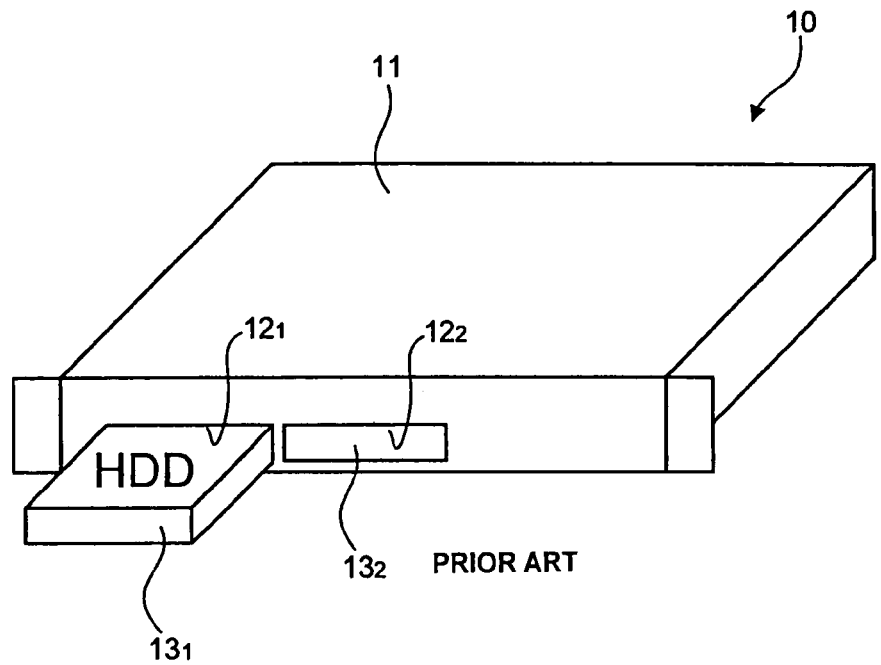
FIG. 9 is a perspective view of an external configuration of a conventional computer device.

Each of the information processing units $50_1, 50_2, 50_3, \ldots$ includes a server function similar to that of the computer device 10 (see FIG. 9).

Two of the information processing units $50_1, 50_2, 50_3, \ldots$ form one set. In FIG. 1, the information processing units $50_1$ and $50_2$ form one set.

The information processing unit $50_1$ includes a storage unit $51_1$ and a processor unit $54_1$. The storage unit $51_1$ and the processor unit $54_1$ can be freely mounted and removed via a connector $53_1$. The storage unit $51_1$ includes an HDD $52A_1$ and an HDD $52B_1$ that are mounted on the same circuit board. The processor unit $54_1$ includes a CPU $55A_1$ and an HDD controller $56A_1$ that are mounted on the same circuit board.

The information processing unit $50_2$ includes a storage unit $51_2$ and a processor unit $54_2$. The storage unit $51_2$ and the processor unit $54_2$ can be freely mounted and removed via a connector $53_2$. The storage unit $51_2$ includes an HDD $52A_2$ and an HDD $52B_2$ that are mounted on the same circuit board. The processor unit $54_2$ includes a CPU $55B_2$ and an HDD controller $56B_2$ that are mounted on the same circuit board.

In the information processing units $50_1$ and $50_2$, components represented by (A) in FIG. 1 (the HDD $52A_1$, the HDD $52A_2$, the CPU $55A_1$, and the HDD controller $56A_1$) form a group A. This group A corresponds to one computer device 10 (see FIG. 9) having a redundant configuration consisting of two HDDs.

In group A, the HDD controller $56A_1$ controls writing to and reading from the HDD $52A_1$ and the HDD $52A_2$, which are large-capacity storage devices that store various types of data handled by the CPU $55A_1$.

The HDD $52A_1$ is connected to the HDD controller $56A_1$ via the connector $53_1$. The HDD $52A_2$ is connected to the HDD controller $56A_1$ via the connector $53_1$, the processor unit $54_2$, the connector $57_2$, the back plane 41, and the connector $57_1$.

The HDD $52A_1$ and the HDD $52A_2$ are mounted by dispersion in physically separate storage units (the storage units $51_1$ and $51_2$).

Components represented by (B) in FIG. 1 (the HDD $52B_1$, the HDD $52B_2$, the CPU $55B_2$, and the HDD controller $56B_2$) form a group B. This group B corresponds to one computer device 10 (see FIG. 9) having a redundant configuration consisting of two HDDs.

In group B, the HDD controller $56B_2$ controls writing to and reading from the HDD $52B_1$ and the HDD $52B_2$, which are large-capacity storage devices that store various types of data handled by the CPU $55B_2$.

The HDD $52B_1$ is connected to the HDD controller $56B_2$ via the connector $53_1$, the processor unit $54_1$, the connector $57_1$, the back plane 41, and the connector $57_2$. The HDD $52B_2$ is connected to the HDD controller $56B_2$ via the connector $53_2$.

The HDD $52B_1$ and the HDD $52B_2$ are mounted by dispersion in physically separate storage units (the storage units $51_1$ and $51_2$).

A hot-swap method according to the first embodiment will be explained with reference to FIGS. 3 to 5. An example in which the HDD $52A_2$ breaks down and is hot-swapped without terminating the operation of the information processing units $50_1$ and $50_2$ will be explained with reference to FIG. 3.

Figure 3:
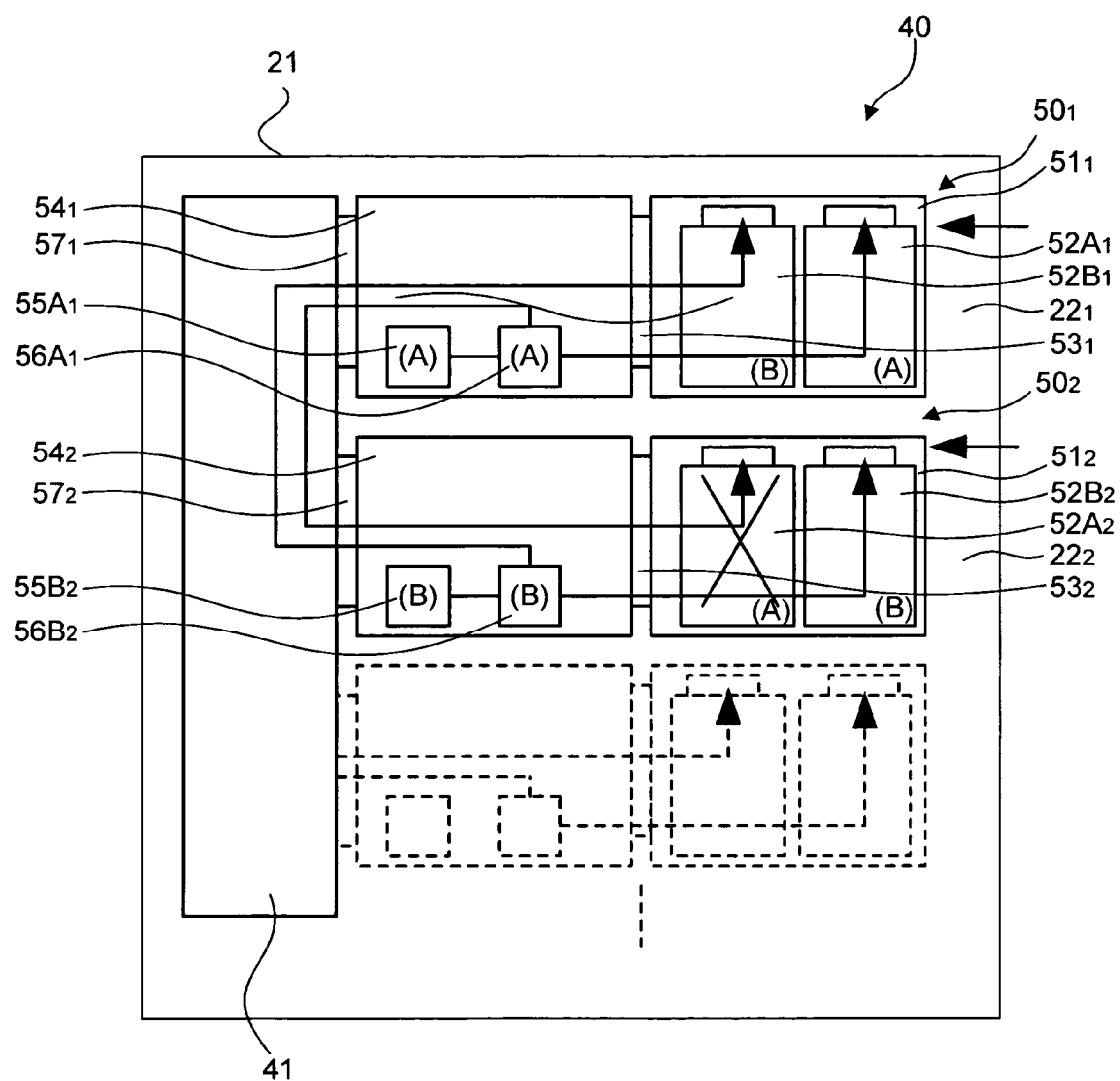
FIG. 3 is a diagram to explain a hot-swap method according to the first embodiment.
Figure 4:
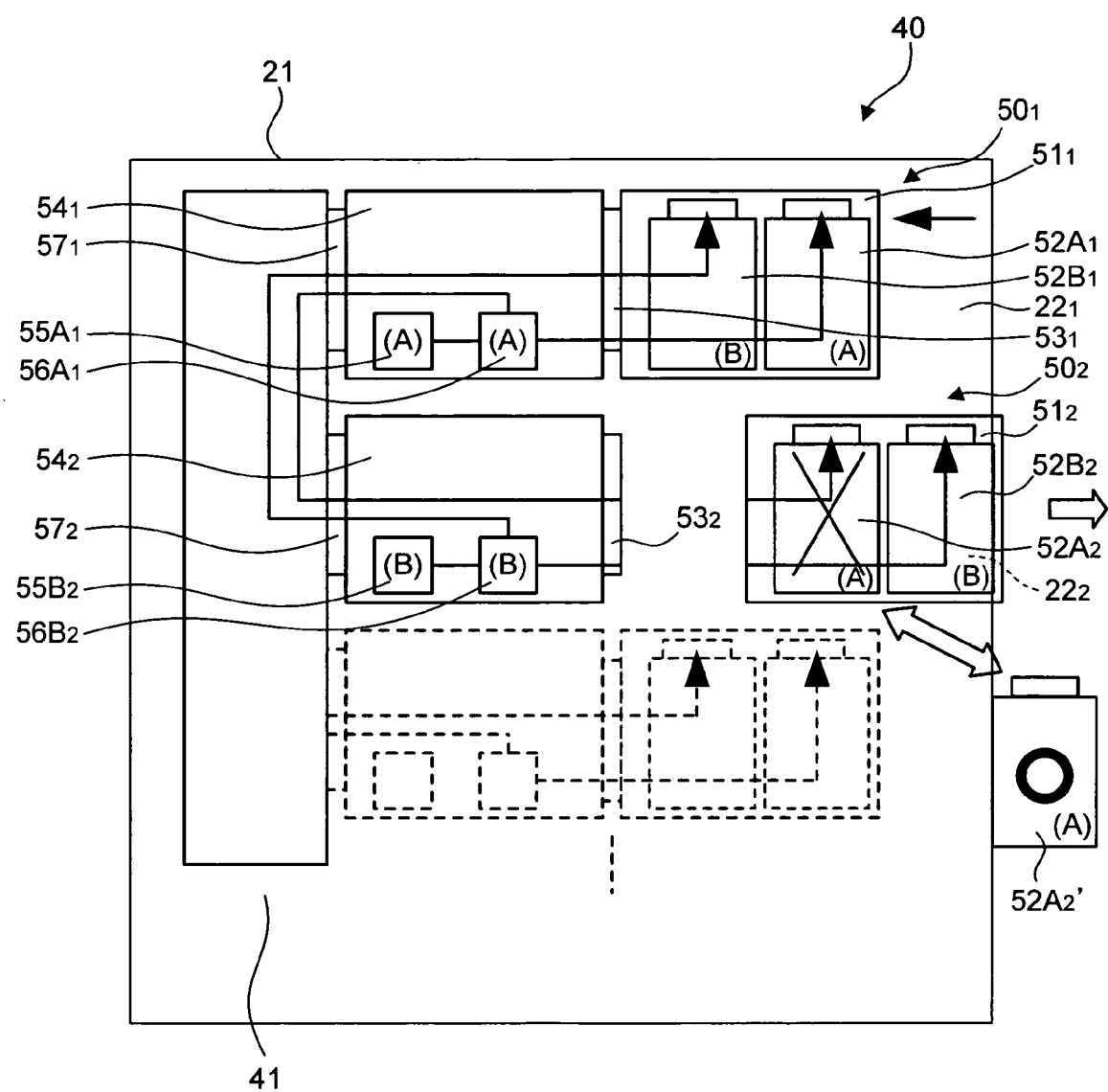
FIG. 4 is another diagram to explain the hot-swap method according to the first embodiment.

In FIG. 3, when the HDD $52A_2$ of the storage unit $51_2$ in group A breaks down, data is recovered from the other HDD $52A_1$ having the redundant configuration, thereby enabling continuous operation.

Due to the breakdown of the HDD $52A_2$, the redundant configuration cannot be utilized in group A, and therefore the HDD $52A_2$ is hot-swapped. As shown in FIG. 4, the storage unit $51_2$ is removed as a whole and separated from the processor unit $54_2$.

In group A, the HDD $52A_1$ is currently used and is accessed by the CPU $55A_1$ and the HDD controller $56A_1$, whereby operation continues without being affected by the hot-swap.

Similarly in group B, the HDD $52B_1$ is currently used and is accessed by the CPU $55B_2$ and the HDD controller $56B_2$, whereby operation continues without being affected by the hot-swap.

In the disconnected storage unit $51_2$, the broken HDD $52A_2$ is replaced with a replacement HDD $52A_2'$.

Figure 5:
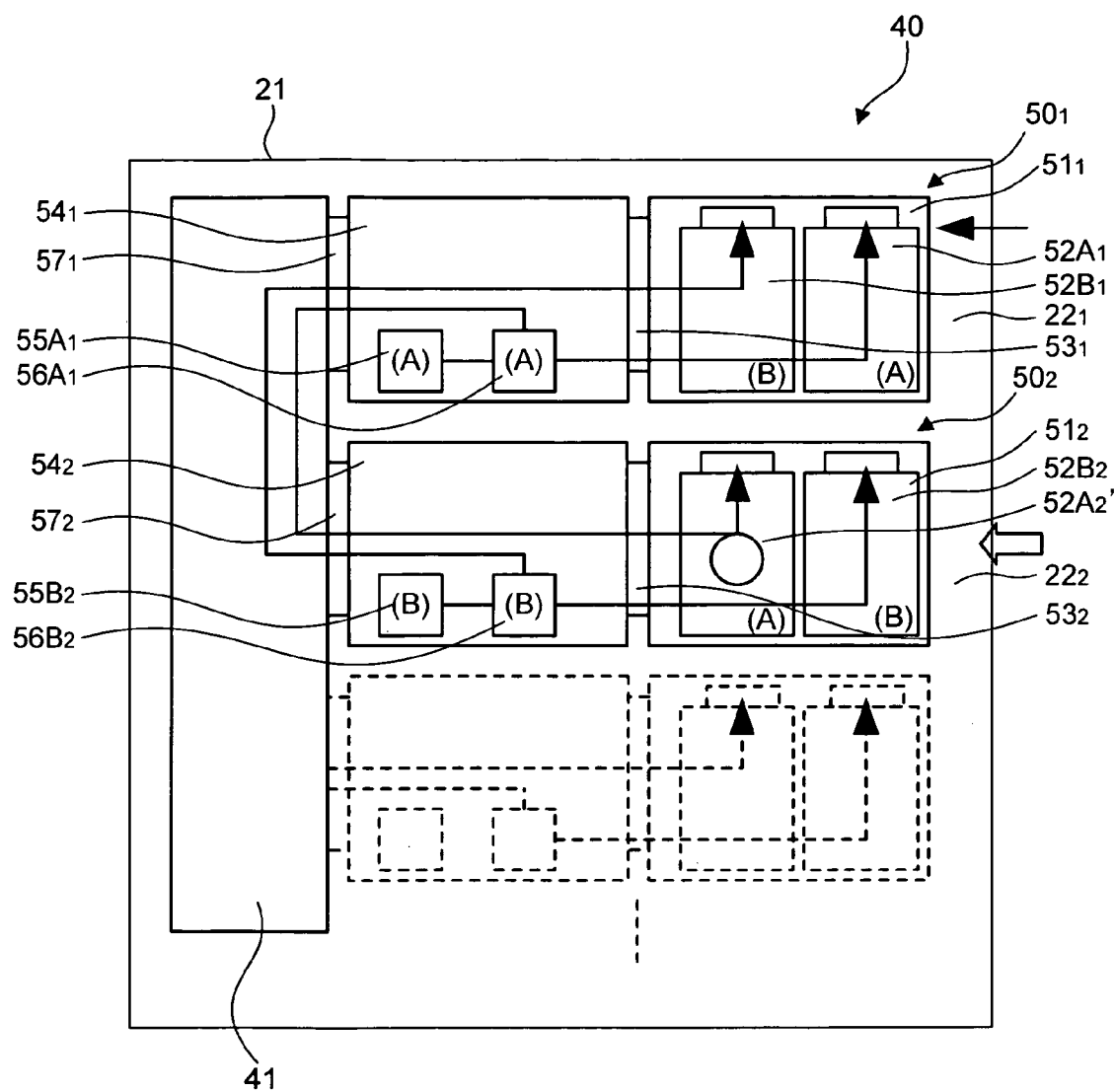
FIG. 5 is still another diagram to explain the hot-swap method according to the first embodiment.

As shown in FIG. 5, after this replacement, the storage unit $51_2$ is mounted on the processor unit $54_2$ via the connector $53_2$. This restores the computer device 40 to its original state before breakdown.

As described above, according to the first embodiment, the HDDs $52A_1$ and $52A_2$ (storage devices) having a redundant configuration are mounted by physical dispersion, in a plurality of freely removable storage units $51_1$ and $51_2$ that form a part of the information processing units $50_1$ and $50_2$. Therefore, even if one HDD $52A_2$ breaks down and the storage unit $51_2$ is removed, the HDD controller $56A_1$ can access the HDD $52A_1$ provided in the other storage unit $51_1$, so the HDDs having the redundant configuration can be hot-swapped in the information processing units $50_1$ and $50_2$.

While the first embodiment describes an example in which an HDD can be hot-swapped when there are two information processing units (information processing units $50_1$ and $50_2$) in one set, it is also possible to hot-swap an HDD when one set consists of three (or four or more) information processing units. An example of such a configuration is described below as a second embodiment.

Figure 6:
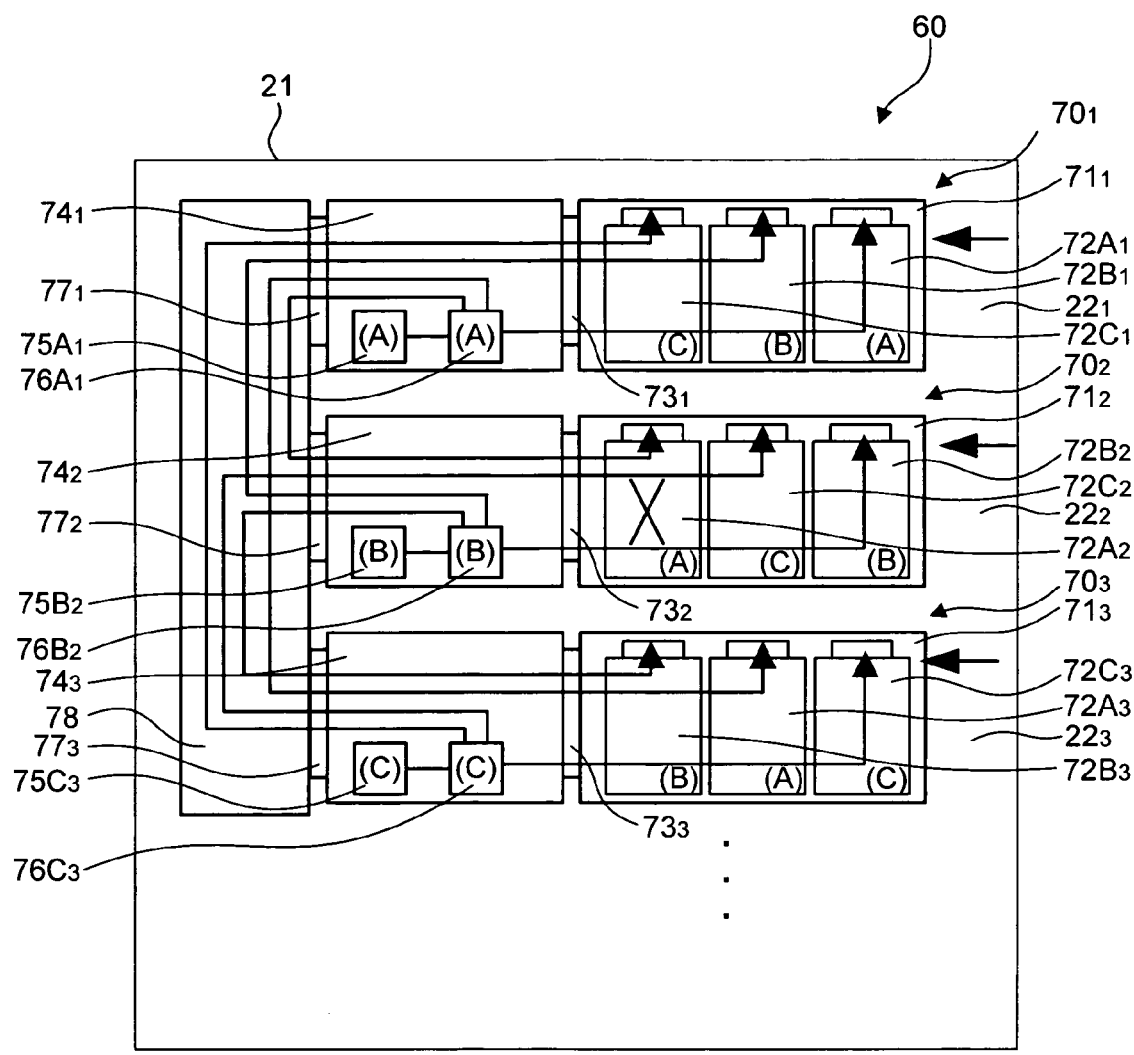
FIG. 6 is a schematic plan view of a configuration of a computer device according to a second embodiment.

FIG. 6 is a schematic plan view of the configuration of a computer device according to the second embodiment of the present invention. In FIG. 6, like reference numerals designate like parts as those shown in FIG. 1.

A computer device 60 shown in FIG. 6 is a cluster server device (blade server device) in which a plurality of card-shaped information processing units $70_1$, $70_2$, $70_3$, . . . can be mounted in the casing 21.

The information processing units $70_1$, $70_2$, $70_3$, . . . can be freely inserted into and removed from slots $22_1$, $22_2$, $22_3$, . . . in the casing 21.

A back plane 78 is provided inside the casing 21, and is physically and electrically connected to the information processing units $70_1$, $70_2$, $70_3$, . . . via connectors $77_1$, $77_2$, $77_3$, . . . . The back plane 78 supplies electrical power to the information processing units $70_1$, $70_2$, $70_3$, . . . and also provides an interface.

Each of the information processing units $70_1$, $70_2$, $70_3$, . . . includes a server function similar to that of the computer device 10 (see FIG. 9).

Three of the information processing units $70_1$, $70_2$, $70_3$, . . . form one set, as shown in FIG. 6.

The information processing unit $70_1$ includes a storage unit $71_1$ and a processor unit $74_1$. The storage unit $71_1$ and the processor unit $74_1$ can be freely mounted and removed via a connector $73_1$. The storage unit $71_1$ includes an HDD $72A_1$, an HDD $72B_1$, and an HDD $72C_1$, which are mounted on the same circuit board. The processor unit $74_1$ includes a CPU $75A_1$ and an HDD controller $76A_1$ that are mounted on the same circuit board.

The information processing unit $70_2$ includes a storage unit $71_2$ and a processor unit $74_2$. The storage unit $71_2$ and the processor unit $74_2$ can be freely mounted and removed via a connector $73_2$. The storage unit $71_2$ includes an HDD $72A_2$, an HDD $72B_2$, and an HDD $72C_2$, which are mounted on the same circuit board. The processor unit $74_2$ includes a CPU $75B_2$ and an HDD controller $76B_2$ that are mounted on the same circuit board.

The information processing unit $70_3$ includes a storage unit $71_3$ and a processor unit $74_3$. The storage unit $71_3$ and the processor unit $74_3$ can be freely mounted and removed via a connector $73_3$. The storage unit $71_3$ includes an HDD $72A_3$, an HDD $72B_3$, and an HDD $72C_3$, which are mounted on the same circuit board. The processor unit $74_3$ includes a CPU $75C_3$ and an HDD controller $76C_3$ that are mounted on the same circuit board.

In the information processing units $70_1$, $70_2$, and $70_3$, components represented by (A) in FIG. 6 (the HDD $72A_1$, the HDD $72A_2$, HDD $72A_3$, the CPU $75A_1$, and the HDD controller $76A_1$) form a group A. This group A corresponds to one computer device 10 (see FIG. 9) having a redundant configuration consisting of three HDDs (n+1 redundant configuration).

In group A, the HDD controller $76A_1$ controls writing to and reading from the HDD $72A_1$, the HDD $72A_2$, and the HDD $72A_3$ which are large-capacity storage devices that store various types of data handled by the CPU $75A_1$.

The HDD $72A_1$ is connected to the HDD controller $76A_1$ via the connector $73_1$. The HDD $72A_2$ is connected to the HDD controller $76A_1$ via the connector $73_2$, the processor unit $74_2$, the connector $77_2$, the back plane 78, and the connector $77_1$.

The HDD $72A_3$ is connected to the HDD controller $76A_1$ via the connector $73_3$, the processor unit $74_3$, the connector $77_3$, the back plane 78, and the connector $77_1$.

The HDDs $72A_1$, $72A_2$, and $72A_3$ are mounted by dispersion in physically separate storage units (the storage units $71_1$, $71_2$, and $71_3$).

Similarly, components represented by (B) in FIG. 6 (the HDD $72B_1$, the HDD $72B_2$, the HDD $72B_3$, the CPU $75B_2$, and the HDD controller $76B_2$) form a group B. This group B corresponds to one computer device 10 (see FIG. 9) having a redundant configuration consisting of three HDDs (n+1 redundant configuration).

In group B, the HDD controller $76B_2$ controls writing to and reading from the HDD $72B_1$, the HDD $72B_2$, and the HDD $72B_3$, which are large-capacity storage devices that store various types of data handled by the CPU $75B_2$.

The HDD $72B_1$ is connected to the HDD controller $76B_2$ via the connector $73_1$, the processor unit $74_1$, the connector $77_1$, the back plane 78, and the connector $77_2$.

The HDD $72B_2$ is connected to the HDD controller $76B_2$ via the connector $73_2$. The HDD $72B_3$ is connected to the HDD controller $76B_2$ via the connector $73_3$, the processor unit $74_3$, the connector $77_3$, the back plane 78, and the connector $77_2$.

The HDDs $72B_1$, $72B_2$, and $72B_3$ are mounted by dispersion in physically separate storage units (the storage units $71_1$, $71_2$, and $71_3$).

Similarly, components represented by (C) in FIG. 6 (the HDD $72C_1$, the HDD $72C_2$, the HDD $72C_3$, the CPU $75C_3$, and the HDD controller $76C_3$) form a group C. This group C corresponds to one computer device 10 (see FIG. 9) having a redundant configuration consisting of three HDDs (n+1 redundant configuration).

In group C, the HDD controller $76C_3$ controls writing to and reading from the HDD $72C_1$, the HDD $72C_2$, and the HDD $72C_3$ which are large-capacity storage devices that store various types of data handled by the CPU $75C_3$.

The HDD $72C_1$ is connected to the HDD controller $76C_3$ via the connector $73_1$, the processor unit $74_1$, the connector $77_1$, the back plane 78, and the connector $77_3$.

The HDD $72C_2$ is connected to the HDD controller $76C_3$ via the connector $73_2$, the processor unit $74_2$, the connector $77_2$, the back plane 78, and the connector $77_3$. The HDD $72C_3$ is connected to the HDD controller $76C_3$ via the connector $73_3$.

The HDDs $72C_1$, $72C_2$, and $72C_3$ are mounted by dispersion in physically separate storage units (the storage units $71_1$, $71_2$, and $71_3$).

Figure 7:
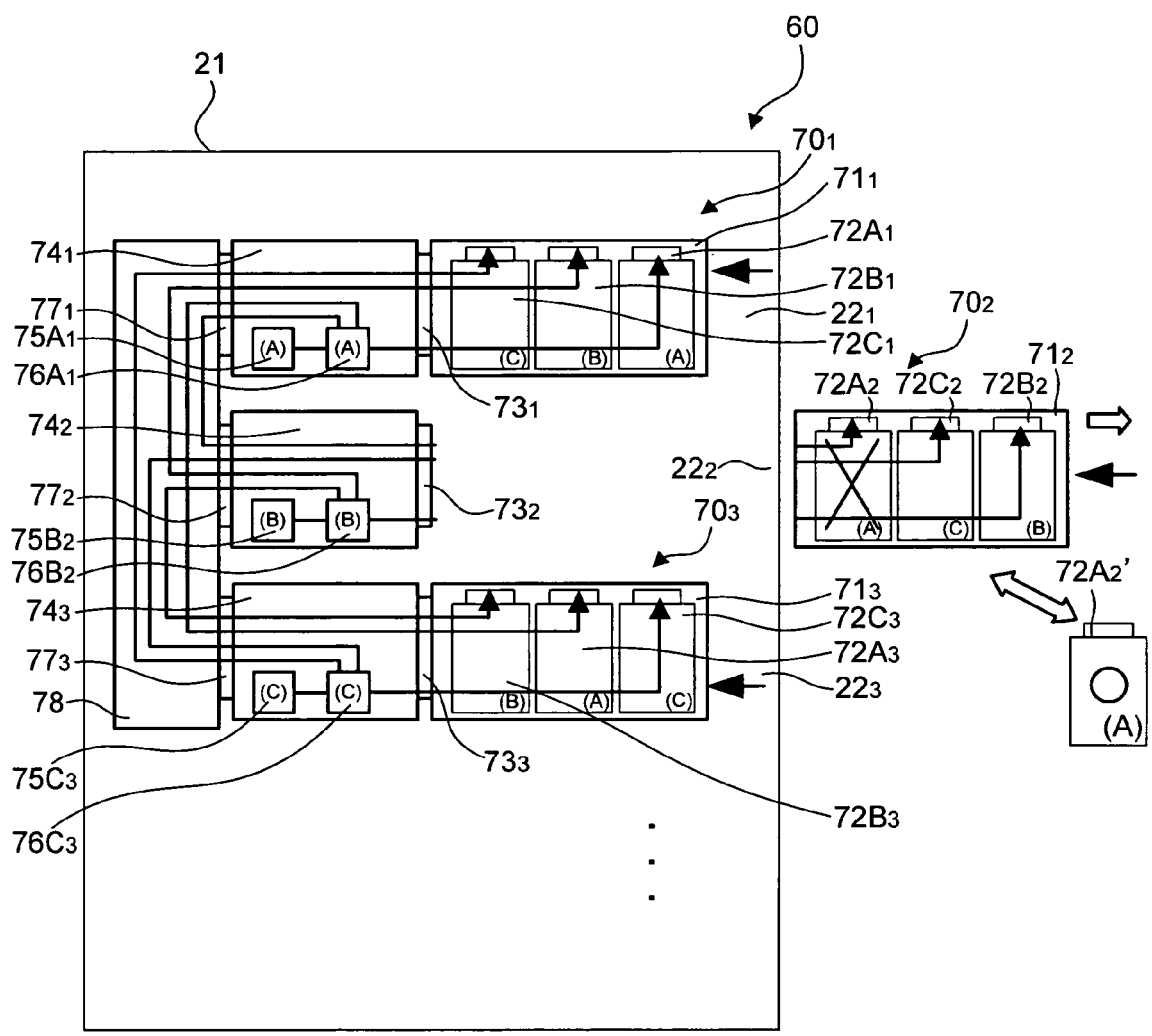
FIG. 7 is a diagram to explain a hot-swap method according to the second embodiment.

A hot-swap method according to the second embodiment will be explained with reference to FIGS. 6 to 8. An example in which the HDD $72A_2$ breaks down and is hot-swapped without terminating the operation of the information processing units $70_1$, $70_2$, and $70_3$ as shown in FIG. 6 will be explained.

In FIG. 6, when the HDD $72A_2$ of the storage unit $71_2$ in group A breaks down, data is recovered from another HDD $72A_1$ (or HDD $72A_3$) having the redundant configuration, thereby enabling continuous operation.

In group A, the HDD $72A_2$ is hot-swapped due to breakdown. As shown in FIG. 7, the storage unit $71_2$ is removed as a whole and separated from the processor unit $74_2$.

In group A, the HDD $72A_1$ (or HDD $72A_3$) is currently used and is accessed by the CPU $75A_1$ and the HDD controller $76A_1$, whereby operation continues without being affected by the hot-swap.

Similarly, in group B, the HDD $72B_1$ (or HDD $72B_3$) is currently used and is accessed by the CPU $75B_2$ and the HDD controller $76B_2$, whereby operation continues without being affected by the hot-swap.

Similarly, in group C, the HDD $72C_1$ (or HDD $72C_3$) is currently used and is accessed by the CPU $75C_3$ and the HDD controller $76C_3$, whereby operation continues without being affected by the hot-swap.

In the disconnected storage unit $71_2$, the broken HDD $72A_2$ is replaced with a replacement HDD $72A_2'$.

Figure 8:
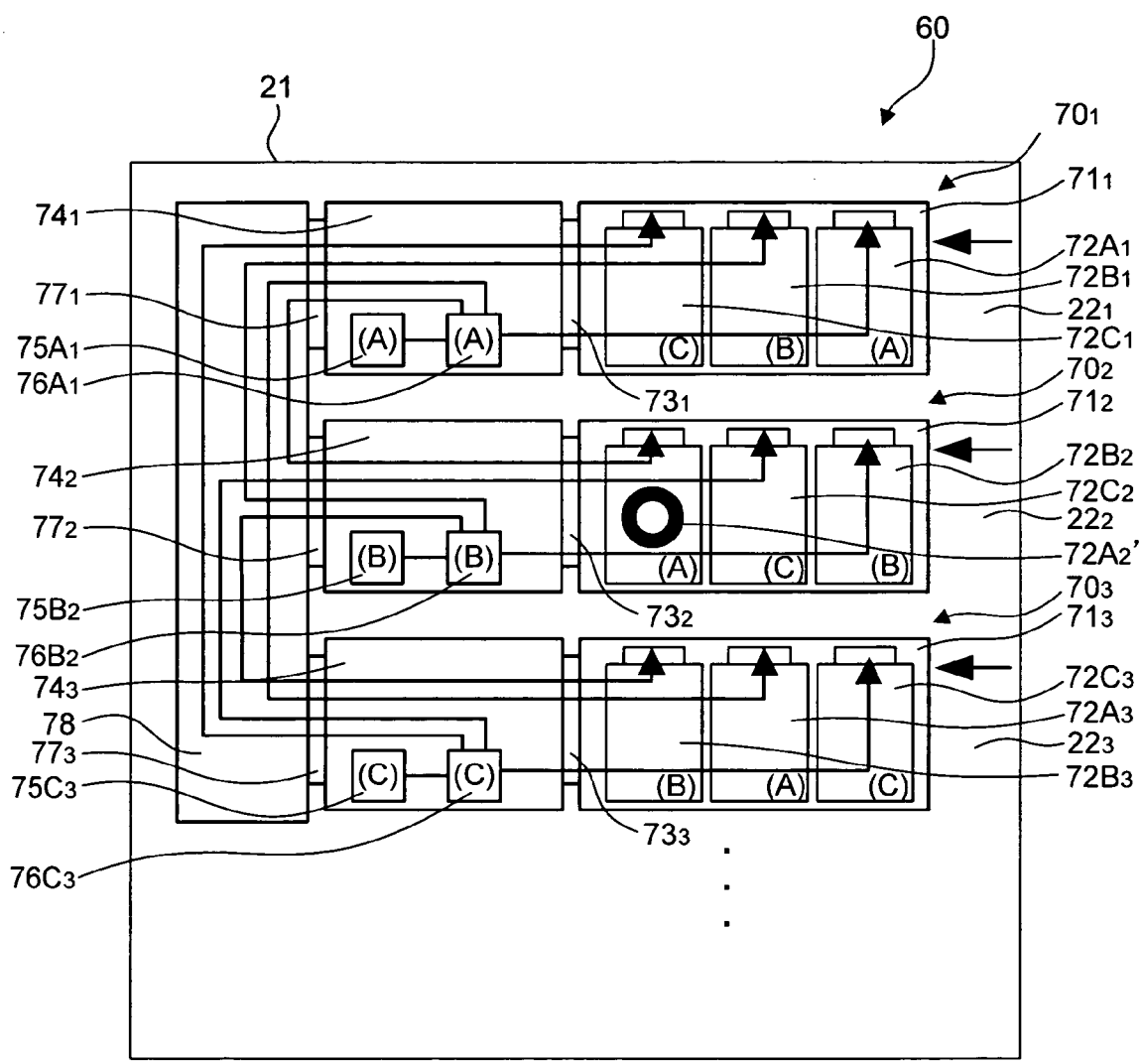
FIG. 8 is another diagram to explain the hot-swap method according to the second embodiment.

As shown in FIG. 8, after this replacement, the storage unit $71_2$ is mounted in the processor unit $74_2$ via the connector $73_2$. This restores the computer device 60 to its original state before breakdown.

As described above, the second embodiment achieves the same effects as the first embodiment.

Although the first and the second embodiments of the present invention have been explained in detail with reference to the accompanying drawings, specific configurational examples are not limited to the embodiments, and any design changes or the like to the embodiments are intended to be embraced in the present invention without departing from the scope of the invention.

As explained above, according to the present invention, a plurality of storage devices having a redundant configuration are mounted by physical dispersion in a plurality of information processing units. Therefore, even if an information processing unit is removed when one of its storage devices breaks down, a controller can access a storage device mounted in another information processing unit, and the storage device having the redundant configuration can be hot-swapped in the information processing units.

According to the present invention, a plurality of storage devices having a redundant configuration are mounted by physical dispersion in a plurality of freely removable storage units that form a part of a plurality of information processing units. Therefore, even if one of the storage devices breaks down and the storage unit is removed, a controller can access a storage device mounted in another storage unit, thereby enabling the storage device having the redundant configuration to be hot-swapped in the information processing units.

According to the present invention, a storage device having a redundant configuration can be hot-swapped in a server having a plurality of information processing units.

According to the present invention, a storage device can be hot-swapped in case of breakdown.

Although the invention has been described with respect to a specific embodiment for a complete and clear disclosure, the appended claims are not to be thus limited but are to be construed as embodying all modifications and alternative constructions that may occur to one skilled in the art that fairly fall within the basic teaching herein set forth.

What is claimed is:

1. A computer device comprising:
a plurality of information processing units configured to execute respective information processing functions and each having at least one removable storage unit;
a plurality of storage devices physically dispersed in each of the at least one storage unit provided in the information processing units, said storage devices being capable of hot-swapping without terminating the operation of the information processing units, and having a redundant configuration, wherein each information processing unit includes at least two storage devices; and
a plurality of controllers configured to access the storage devices, wherein:
the information processing units are grouped into sets;
a number of information processing units in one set is equal to a number of storage devices accessible to each of the controllers within one set; and
in each set, each of the controllers is mounted on each of the information processing units, and accesses only one of the plurality of storage devices within each of the information processing units included in the set.

2. The computer device according to claim 1, wherein
the storage devices are removable,
the information processing units include at least a first information processing unit and a second information processing unit, and
when a storage device in the first information processing unit is unusable, the controller uses a storage device in the second information processing unit.

3. The computer device according to claim 1, wherein the information processing unit functions as a server.

4. A computer device comprising:
a plurality of information processing units configured to execute respective information processing functions;
a plurality of storage units arranged in the information processing units, and that are removable, wherein one information processing unit includes one storage unit;
a plurality of storage devices physically dispersed in the storage units and having a redundant configuration, said storage devices being capable of hot-swapping without terminating the operation of the information processing units, wherein one storage unit includes at least two storage devices; and
a plurality of controllers configured to be installed in the information processing units and to access the storage devices, wherein each information processing unit includes one of the controllers,
wherein the information processing units are grouped into sets, and a number of information processing units in one set is equal to a number of storage devices accessible to each of the controllers.

5. The computer device according to claim 4, wherein
the storage devices are removable,
the information processing units include at least a first information processing unit and a second information processing unit, and
when a storage device in a first information processing unit is unusable, the controller in the first information processing unit uses a storage device in the second information processing unit.

6. The computer device according to claim 4, wherein the information processing unit functions as a server.

7. A cluster server device comprising:
a plurality of information processing units, each capable of functioning as a server and each having at least one removable storage unit;
a plurality of storage devices physically dispersed in each of the at least one storage unit provided in the information processing units, said storage devices being capable of hot-swapping without terminating the operation of the information processing units, and having a redundant configuration, wherein each information processing unit includes at least two storage devices; and
a plurality of controllers configured to access the storage devices,
wherein the information processing units are grouped into sets, and a number of information processing units in one set is equal to a number of storage devices accessible to each of the controllers within one set, each of which is mounted on each of the information processing units, and accesses only one of the plurality of storage devices within each of the information processing units included in the set.

8. The cluster server device according to claim 7, wherein the information processing units include at least a first information processing unit and a second information processing unit, and
when one of the storage devices in the first information processing unit is unusable, the controller uses another one of the storage devices in the second information processing unit.

9. A cluster server device comprising:
a plurality of information processing units, each capable of functioning as a server;
a plurality of storage units arranged in the information processing units, and that are removable, wherein one information processing unit includes one storage unit;
a plurality of storage devices physically dispersed in the storage units, said storage devices being capable of hot-swapping without terminating the operation of the information processing units, and having a redundant configuration, wherein one storage unit includes at least two storage devices; and
a plurality of controllers configured to be installed in the information processing units, and to access the storage devices, wherein each information processing unit includes one of the controllers,
wherein the information processing units are grouped into sets, and a number of information processing units in one set is equal to a number of storage devices accessible to each of the controllers.

10. The cluster server device according to claim 9, wherein the storage devices are removable,
the information processing units include at least a first information processing unit and a second information processing unit, and
when a storage device in a first information processing unit is unusable, the controller in the first information processing unit uses a storage device in the second information processing unit.

11. An information processing device comprising:
a plurality of processing units each including a processor, a storage controller, and at least one removable storage unit, wherein the at least one removable storage unit is detachably connected to the processing unit, and includes a plurality of storage devices, said storage devices having redundant configuration and being capable of hot-swapping without terminating the operation of the information processing unit; and
a back plane to which each of the processing units is detachably connected, wherein
the information processing units are grouped into sets, and a number of information processing units in one set is equal to a number of storage devices accessible to each of the controllers within one set, each of which is mounted on each of the information processing units, and accesses only one of the plurality of storage devices within each of the information processing units included in the set.

12. A computer device, comprising:
a backplane unit; and
a plurality of information processing units each connected to the backplane unit, each of the information processing units, including:
a processor unit,
a storage unit attached to the processor unit in a removable manner,
a plurality of storage devices contained in the storage unit, and
a controller mounted on the processor unit that is connected to and controls access to at least one of the storage devices in a storage unit attached to the processor unit in which the controller is mounted, and to at least one of the storage devices in a storage unit attached to the other processing unit through the backplane, respectively,
wherein the information processing units are grouped into sets, and a number of information processing units in one set is equal to a number of storage devices accessible to each of the controllers within one set, each of which is mounted on each of the information processing units, and accesses only one of the plurality of storage devices within each of the information processing units included in the set.

13. The computer device according to claim 12, wherein each of the storage devices contained in the same storage unit is connected to the controller mounted in the different processor units, respectively.

14. A computer device, comprising:
a plurality of processing units connected to each other;
a plurality of storage units, each of the storage units is connected to one of the processing units in a removable manner, and contains a plurality of storage devices, respectively; and
a plurality of controllers, each of the controllers is mounted on corresponding processing units respectively, and is configured to control an access to the storage devices, wherein
a storage device contained in one of the storage units forms a redundant group with a storage device contained in the other storage unit, and the storage devices forming the redundant group are connected to, and are controlled by, the single controller that is mounted on one of the processor units,
wherein the processing units are grouped into sets, and a number of processing units in one set is equal to a number of storage devices accessible to each of the controllers within one set, each of which is mounted on each of the processing units, and accesses only one of the plurality of storage devices within each of the processing units included in the set.

15. A cluster service device, comprising:

a plurality of information processing units connected to each other, each of the information processing units is capable of functioning as a server, and contains a controller that is configured to control an access to storage devices respectively; and a plurality of storage units, each of the storage units is connected to one of the processing units in a removable manner, and contains a plurality of storage devices respectively, wherein, a storage device contained in one of the storage units forms a redundant group with a storage device contained in the other storage unit, and the storage devices forming the redundant group are connected to, and are controlled by the same controller that is mounted on one of the processor units wherein the information processing units are grouped into sets, and a number of information processing units in one set is equal to a number of storage devices accessible to each of the controllers within one set, each of which is mounted on each of the information processing units, and accesses only one of the plurality of storage devices within each of the information processing units included in the set.

* * * * *